United States Patent
Huang et al.

(10) Patent No.: US 10,656,530 B2
(45) Date of Patent: May 19, 2020

(54) APPLICATION OF FREEFORM MRC TO SRAF OPTIMIZATION BASED ON ILT MASK OPTIMIZATION

(71) Applicant: ASML US, LLC, Chandler, AZ (US)

(72) Inventors: Jihui Huang, San Jose, CA (US); Ke Zhao, San Jose, CA (US); Jiangwei Li, San Jose, CA (US)

(73) Assignee: ASML US, LLC, Chandler, AZ (US)

(*) Notice: Subject to any disclaimer, the term of this patent is extended or adjusted under 35 U.S.C. 154(b) by 150 days.

(21) Appl. No.: 15/973,809

(22) Filed: May 8, 2018

(65) Prior Publication Data

US 2019/0346768 A1 Nov. 14, 2019

(51) Int. Cl.
*G06F 17/50* (2006.01)
*G03F 7/20* (2006.01)

(52) U.S. Cl.
CPC .................. *G03F 7/705* (2013.01)

(58) Field of Classification Search
CPC ...................................... G03F 7/705
USPC ............................................ 716/52
See application file for complete search history.

(56) References Cited

U.S. PATENT DOCUMENTS

| | | | | |
|---|---|---|---|---|
| 7,441,227 B2* | 10/2008 | Abrams | ................... | G03F 1/36 716/52 |
| 7,480,889 B2* | 1/2009 | Abrams | ................... | G03F 1/36 257/440 |
| 7,487,489 B2* | 2/2009 | Granik | ................... | G03F 1/36 716/51 |
| 7,698,665 B2* | 4/2010 | Abrams | ................... | G03F 1/68 716/55 |
| 7,703,049 B2* | 4/2010 | Abrams | ................... | G03F 1/36 716/50 |
| 7,707,541 B2* | 4/2010 | Abrams | ................... | G03F 1/36 378/35 |
| 7,921,385 B2* | 4/2011 | Abrams | ................... | G03F 1/68 716/50 |
| 7,987,434 B2* | 7/2011 | Granik | ................... | G03F 1/36 716/50 |
| 8,479,125 B2* | 7/2013 | Pierrat | ................... | G03F 1/36 716/50 |
| 9,310,674 B2* | 4/2016 | Azpiroz | ................... | G03F 1/76 |
| 2008/0122858 A1* | 5/2008 | Wilensky | ............. | G06T 15/503 345/592 |
| 2010/0023915 A1* | 1/2010 | Granik | ................... | G03F 1/36 716/50 |
| 2019/0324366 A1* | 10/2019 | He | ............. | G03F 1/70 |

* cited by examiner

*Primary Examiner* — Suchin Parihar
(74) *Attorney, Agent, or Firm* — Pillsbury Winthrop Shaw Pittman LLP

(57) ABSTRACT

Extracting shapes from a pixelated SRAF bitmap image of pixels for mask making is disclosed. A method includes receiving the pixelated SRAF bitmap image of pixels, each pixel having a respective brightness value; selecting a ridge point in the pixelated SRAF bitmap image; for each pixel of at least some of the pixels, determining a respective arrival time at the pixel; and determining a mask shape using the arrival times of the at least some of the pixels. The ridge point is one of the pixels and is selected based on the respective brightness value of the one of the pixels. An arrival time is based on a respective brightness value of the pixel and a Mask Rule Check (MRC) rule.

20 Claims, 7 Drawing Sheets

APPLICATION OF FREEFORM MRC TO SRAF OPTIMIZATION BASED ON ILT MASK OPTIMIZATION

TECHNICAL FIELD

This disclosure relates to mask making for manufacturing integrated circuits (ICs). More specifically, this disclosure relates to integrating mask-manufacturing rule checking (MRC) into an inverse lithography technique (ILT).

BACKGROUND

In semiconductor manufacturing, charged particle beams have been widely used to make high-precision masks. For example, mask makers (or "mask writers") can use electron beams ("e-beams" or simply "beams") to transfer design patterns onto masks (referred to as "mask patterns"). Software tools have been used to create and optimize the design patterns to fulfill design objectives. The mask patterns are transferred onto a substrate (e.g., a wafer) by a lithography process. The substrate with transferred patterns (referred to as "substrate patterns") can be treated by following mechanical and chemical processes for manufacturing ICs. The design of the mask can significantly affect the quality of the resulting manufactured ICs. Therefore, it is desirable to produce mask patterns that eliminate (or, at least, significantly reduce) differences between the design patterns and the manufactured ICs.

SUMMARY

Disclosed herein are methods, apparatuses, and systems for application of freeform MRC to sub-resolution assist features (SRAF) optimization based on ILT mask optimization.

In an aspect, a method of extracting shapes from a pixelated SRAF bitmap image of pixels for mask making is disclosed. The method includes receiving the pixelated SRAF bitmap image of pixels, each pixel having a respective brightness value; selecting a ridge point in the pixelated SRAF bitmap image; for each pixel of at least some of the pixels, determining a respective arrival time at the pixel; and determining a mask shape using the arrival times of the at least some of the pixels. The ridge point is one of the pixels and is selected based on the respective brightness value of the one of the pixels. An arrival time is based on a respective brightness value of the pixel and a Mask Rule Check (MRC) rule.

In another aspect, an apparatus for determining sub-resolution assist features (SRAFs) for mask making is disclosed. The apparatus includes a processor and a memory configured to store instructions executable by the processor to receive a pixelated SRAF bitmap image of pixels, each pixel having a respective brightness value; determine, using a fast marching method (FMM), arrival times for at least some of the pixels; and determine an SRAF shape using the arrival times of the at least some of the pixels. The FMM uses a speed function that is based on a Mask Rule Check (MRC).

In another aspect, another method for extracting shapes from a pixelated SRAF bitmap image of pixels for mask making is disclosed. The method includes receiving the pixelated SRAF bitmap image of pixels, each pixel having a respective brightness value; calculating a speed image, for use with a fast marching method, with mask-manufacturing (MRC) rules, the speed image being based on pixel brightness values; generating an arrival time map using the fast marching method; determining a binary SRAF image using the arrival time map; and resolving MRC rule violations in the binary SRAF image.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
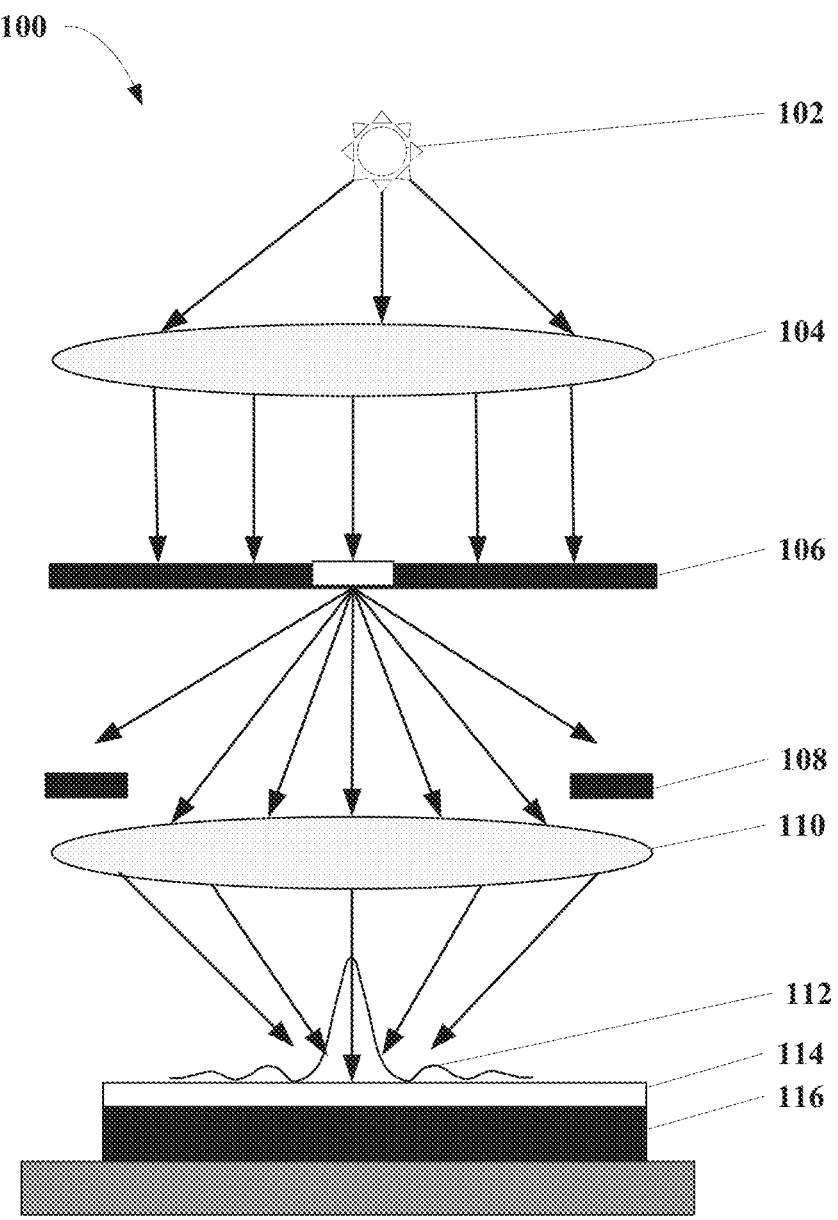
FIG. 1 is an example of a lithography system.

The manufacture of microchip devices continually strives for smaller sized elements to achieve higher density for integrated circuit (IC) designs on a target wafer. A wafer, also referred to as a substrate, is a thin slice of semiconductor material used for the fabrication of integrated circuits. For example, demand for 10 nanometer (nm) resolution and beyond now exists for features of logic circuits and arrays (e.g., finFETs, DRAMs, 3D NAND, etc.) in microchip semiconductor fabrication.

The process of manufacturing integrated circuits (ICs) involves several phases. In a simplified view, the process includes a design phase, a manufacturing phase, and an inspection phase. The design phase can include simulations of the manufacturing phase and the inspection phase. Simulations of the manufacturing and inspection processes during the design phase are encompassed within the manufacturing and inspection phases, respectively.

During the design phase, a mask (akin to a photographic negative and as further described below) is designed. The mask is used during the lithography process (i.e., the manufacturing process) to etch design patterns (e.g., design shapes) onto a wafer. The design patterns and shapes are also referred to herein as polygons or design polygons. A "polygon," as used herein, also encompasses curvilinear shapes, or portions thereof, that are approximated using line segments. For example, a circle can be approximated using a set of short segments connected head to tail.

A mask typically includes printable and non-printable shapes. The printable shapes can be the design shapes, and, as such, are to be printed on the wafer. The non-printable shapes are not to be printed on the wafer. The non-printable shapes are usually referred to as sub-resolution assist features (SRAFs). SRAFs improve the accuracy, quality, and/or process window for an IC during the manufacturing process.

Limitations may exist on mask designs. Such limitations are collectively referred to as mask manufacturing rules. Mask manufacturing rules can be geometry-based rules and/or process-based rules. The process of determining whether any mask manufacturing rules are violated is referred to as mask-manufacturing rule checking (MRC). An "MRC rule," as used herein, refers to a rule that is checked during the mask-manufacturing rule checking process.

The geometry-based limitations may be related to the mask writer. Examples of geometry-based rules include: inter-shape rules and intra-shape rules. Inter-shape MRC rules are rules that involve more than one shape; intra-shape MRC rules are rules that involve one shape. The geometry-based rules can be related to the mask writer (e.g., ebeam).

Examples of inter-shape MRC rules include: the corner-to-corner distance (i.e., a "corner-to-corner" rule) between two adjacent shapes cannot be less than a first minimal distance (e.g., 12 nm); the distance between edges (i.e., an "edge-distance" rule) of two adjacent polygons cannot be less than a second minimal distance; and the number of polygons within any area (i.e., an "area" rule) of a certain radius of the wafer cannot not exceed a maximal number of polygons.

Examples of intra-shape MRC rules include: polygon areas (i.e., an "area" rule) cannot be less than a certain value (e.g., 100 nm$^2$); the diagonal (i.e., a "diagonal" rule) of any polygon (e.g., a rectangle) cannot be less than a certain size (e.g., 20 nm); the maximum edge size of an SRAF (e.g., an "SRAF maximum size" rule) cannot exceed a maximum threshold size; and the minimum edge size of a main shape (e.g., a "main shape minimum size" rule) cannot be less than a minimum threshold size.

The process-based limitations may be due to the lithography process. A mask is typically provided to a fabrication shop, which uses the mask to produce ICs. During the manufacturing process, or during the inspection phase, it may be discovered that certain of the mask shapes (i.e., polygons) cannot be manufactured into the desired design shapes or geometry and/or produce defective ICs. Such defects are typically fed back to the mask designer (who iterates the mask design), and are turned into additional mask manufacturing rules that are checked during the mask-manufacturing rule checking (MRC) process.

During the design phase, optical proximity correction (OPC) can be used to compensate for image (i.e., design shape) errors. Image errors refer to situations where the shapes produced (i.e., etched, printed, etc.) on a wafer deviate in unacceptable ways (e.g., tolerances) from the design patterns. Image errors can be caused, for example, by limitations of the ebeam. OPC tools operate in the polygon domain, and, even more specifically, in the segment domain.

Optical proximity correction (OPC) is a resolution enhancement technique (RET) used in mask making to improve the fidelity of the substrate patterns during pattern transfer, especially for small-dimensioned mask patterns. Due to diffraction of light, the mask image can be different from the design patterns, which can be propagated to the aerial image. OPC can pre-compensate for such optical effects in addition to physical and chemical effects in the pattern transfer process. OPC can modify the polygons of the mask patterns by fragmenting (or "bisecting") edges of the polygons (e.g., rectangles) into segments. For example, an edge of a polygon can be bisected into 5 or 6 segments, or a polygon can be bisected into 20 to 30 segments in total. Each segment can be a variable (referred to as an "optimization variable") for mask image optimization. For example, segments can be added, subtracted, moved, merged, or rotated, independently or interdependently, such as by lengthening an edge, displacing an edge (referred to as "edge-biasing"), or adding sub-resolution assistant features (SRAF) to the main patterns. As used herein, the term "main pattern" refers to the mask patterns to be transferred onto the substrate. The SRAFs can modify the substrate patterns in the optical process but are not transferable to the substrate.

After adjusting the segments, simulations (e.g., rule-based or model-based simulations) can be performed to simulate the substrate patterns transferred from the OPC-optimized mask patterns. For example, the polygons in the mask pattern can be rendered (also referred to as "dithered") to form a mask image, and the mask image can be transformed to the substrate pattern in subsequent simulations. The OPC-based mask pattern optimization can be repeated until the substrate patterns are deemed as being sufficiently similar to the design patterns (e.g., the difference between them falls under a threshold).

Inverse lithography techniques (ILT) can be used to, for example, extract mask patterns (i.e., mask shapes) from a printed wafer. As further described below, ILT can be understood to generate a mask image from the design pattern. The ILT process simulates the reverse of the lithography process. For example, the ILT process can receive, as input, the desired design pattern, inverse-simulate the lithography process, and output a mask image (i.e., a bitmap of pixels). Shape extraction can then be performed on the mask image to generate a mask. The mask can include printable and non-printable mask shapes. The mask can be further optimized to generate an optimized mask that can be used for printing the design pattern during the manufacturing process. As mentioned, the ILT process can generate a pixelated image (i.e., a bitmap). As such, ILT tools operate in the image (i.e., pixel) domain.

ILT is a process-window-based optimization method that can be used to improve substrate pattern fidelity. As used herein, the term "process window" refers to a range of values of parameters (referred to as "process parameters") that allows an IC to be manufactured and operate under design specifications. ILT can be used to optimize a mask image for controlling process parameters of a pattern transfer process to be within tolerance allowance. The ILT process can be implemented herein as a software or hardware module. Design patterns can be inputted to an ILT module to perform an image-based optimization for generating an optimized mask image (e.g., a high-resolution mask image). ILT can be implemented based on modeling (e.g., functional transformation) of a lithography process. For example, the modeling can simulate electromagnetic, optical, chemical, and/or lithographic transfer effects. Because the forward transfer is many-to-one (e.g., many different mask images can produce the same substrate patterns), the ILT can also be considered an optimization technique.

ILT can be used to optimize the mask patterns on a pixel level, in which the dithering of the polygons in the OPC-based optimization can be omitted. The physical size of the pixels can be determined based on a domain (e.g., a size) and fineness (i.e., resolution) of the mask image. Each pixel can be an optimization variable. By controlling the granularity of the mask image, the optimization variables (e.g., a total number of pixels used in ILT can be fewer than the optimization variables (e.g., a total number of segments of polygons) used in OPC, by which the efficiency of mask pattern optimization can be improved.

Accordingly, ILT can be used to optimize a mask image, which is in the pixel domain. The mask image can be viewed as a pixelated image where certain pixels are highlighted and certain other pixels are not highlighted. Different pixel intensities can correspond to the level of exposure at that location to light, such as from the ebeam. Shape extraction methods can be used to extract shapes from the optimized mask image. MRC rules can then be applied to the extracted shapes. Such a process is sub-optimal because ILT optimizes the mask image, which is in the pixel domain, without taking into consideration any MRC rules, which are in the polygon and process domains.

In an example, MRC and ILT can be used iteratively, but sequentially. For example, a penalty function (or value) may be associated with an MRC rule. After shapes are extracted using ILT, the extracted shapes are evaluated using the penalty function. The penalty function can be used, for example, to determine whether a pixel of the mask image is to be optimized or discarded. As such, shapes from a mask image are extracted, the MRC rules are evaluated (via the penalty function), some pixels may be optimized and some other pixels may be discarded to produce a new mask image, and the process repeats until an acceptable mask image is obtained. An acceptable mask image can be an image that meets a certain criterion, such as an EPE error below a certain threshold.

In another example, shapes can be extracted from a mask image regardless of whether MRC rules are violated or not. OPC can be performed on the extracted shapes. The process of applying OPC can result in segmentation of the polygons and/or moving of polygon edges. The MRC rule checking can be applied to the result of, and/or during, the OPC step. The process can be repeated.

As such, a need exists for integrating MRC rules into the mask image optimization process. Implementations according to this disclosure can combine pixel-level techniques (e.g., for shape extraction) with polygon-level techniques (e.g., for MRC rule checking) into one co-optimization technique. That is, shape-based rules can be applied to, or based on, a pixelated mask image (i.e., a bitmap). The MRC rules can be considered (i.e., evaluated, checked, etc.) at the time of shape extraction. Accordingly, polygons (i.e., shapes) that do not violate the MRC rules can be extracted from the mask image. As such, mask shapes can be extracted while performing MRC.

Implementations according to this disclosure do not impose restrictions, per se (as described above), during image optimization, thereby avoiding problems associated with optimization techniques that optimize for too many constraints. Generally, optimizing for too many constraints can result in a solution that is a local optimum (i.e., maximum or minimum) as opposed to the global optimum.

Masks generated using the techniques disclosed herein can result in smaller Edge Placement Errors (EPEs). More specifically, for example, by applying MRC rules during ILT mask optimization, SRAFs of a mask can be optimized. In an example, MRC can be integrated with a shape extraction method during the ILT mask optimization process. The shape extraction method can be a high-speed shape extraction method, such as the Fast Marching Method (FMM).

As mentioned above, for mask making (e.g., at or by a mask shop), the polygons of the mask patterns are provided as an input. The polygons can be extracted from the pixelated mask image. During the extraction, the polygons can include curvilinear shapes and/or any generic geometric shapes. The polygons can include printable patterns (i.e., design patterns) and non-printable patterns (i.e., SRAFs).

Implementations according to this disclosure can use an enhanced fast marching method (FMM) for SRAF polygon extraction by incorporating MRC rule checking into the shape extraction speed function of the enhanced FMM.

Details are described herein after first describing an environment in which freeform MRC is applied to SRAF optimization based on ILT mask optimization may be implemented. "Freeform" in this context means that at least some MRC rules are not being applied to polygons (e.g., mask polygons), as is typically the case with MRC rules; rather the at least some of the MRC rules can be applied in the pixel domain, such as, for example, during an ILT shape extraction process.

FIG. 1 is an example of a lithography system 100. A light source 102 emits light that passes through a lens system 104 (e.g., a condenser lens system). The lens system 104 can transform the light as collinear. The collinear light illuminates a mask 106. A mask 106 can include patterns or shapes (referred to as "mask patterns") representing desired shapes to be transferred onto a substrate (e.g., a silicon wafer). The desired shapes can be shapes created during the design phase.

The material (e.g., quartz) of the mask 106 can be made to have different transmittances in different regions to represent the mask patterns. The light passing through the mask 106 carries the information of the mask patterns, which can form an image near the surface of a downstream side of the mask 106, which can be referred to as a "mask image." After passing through an aperture 108 and an objective lens system 110, the mask image can be focused to form an aerial image 112 (represented as intensity distributions in FIG. 2) above a photoresist 114 coated upon a substrate 116.

The incident light can expose regions of the photoresist 114 that modify the chemical properties of the photoresist 114. The modified photoresist 114 can be removed by applying a chemical solution (referred to as a "developer") to the exposed regions of the photoresist 114, which exposes regions of the substrate underneath. The exposed regions of the substrate 116 can be etched (e.g., by an acid), while the unexposed regions of the substrate 116 can be protected by the unmodified regions of the photoresist 114. After the etching, the unmodified regions of the photoresist 114 can be removed by a chemical (referred to as a "resist stripper"), after which the mask patterns are transferred to the substrate (referred to as "substrate patterns").

The mask 106 can be used in optical lithography (referred to as an "optical mask"). A mask writing process can convert design patterns (e.g., including polygons) into the mask patterns. During the mask writing process, the design patterns can be transferred onto a photoresist layer of a mask blank (e.g., a quartz substrate covered with a layer of chromium) using a light beam (e.g., in a laser writer) or an e-beam (e.g., in an e-beam writer). The beam can be controlled to move across the surface of the photoresist layer in a predetermined scan manner (e.g., a raster scan manner). The photoresist on the mask can be modified. In a process similar to developing, etching, and resist stripping, the chromium layer can be etched to incorporate the transferred design patterns that are able to transmit light.

The light emitted by the light source 102 may be diffracted, thereby causing deviations between the design patterns or shapes and the patterns or shapes of the integrated circuit. Deviations can also be caused by other process effects during the etching process. For example, it may not be possible, due to limitations of light, to maintain exact placement of edges.

Figure 2:
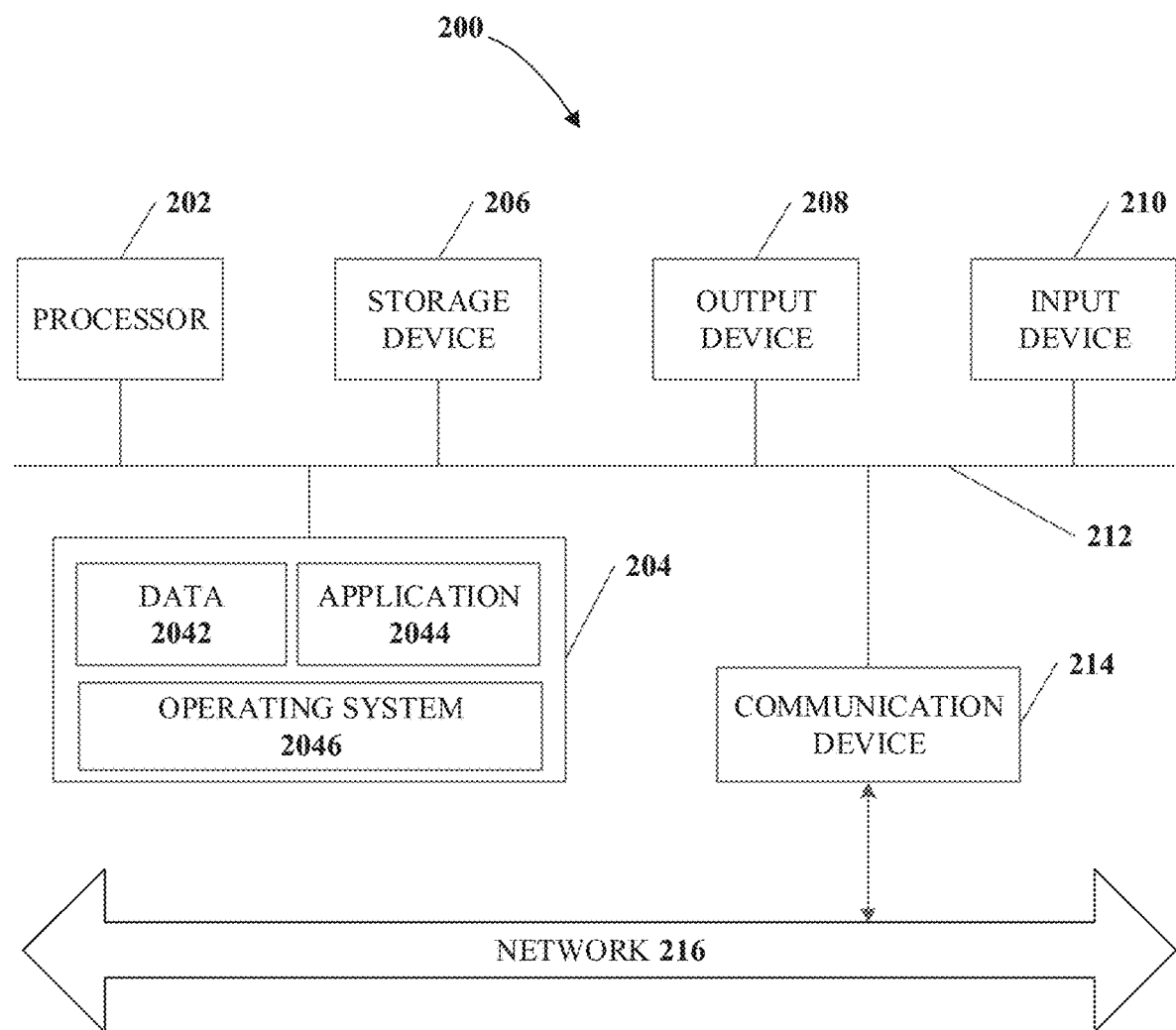
FIG. 2 is a diagram of an example apparatus that can be used for applying freeform MRC to SRAF optimization based on ILT mask optimization according to implementations of this disclosure.

FIG. 2 is a diagram of an example apparatus 200 that can be used for applying freeform MRC to SRAF optimization based on ILT mask optimization according to implementations of this disclosure. The apparatus 200 can include any number of any configurations of computing devices, such as a microcomputer, a mainframe computer, a supercomputer, a general-purpose computer, a special-purpose/dedicated computer, an integrated computer, a database computer, a remote server computer, a personal computer, or a computing service provided by a computing service provider, for example, a web host or a cloud service provider. In some implementations, the computing devices can be implemented in the form of multiple groups of computers that are at different geographic locations and can communicate with one another, such as by a network. While certain operations can be shared by multiple computers, in some implementations, different computers can be assigned to different operations. In some implementations, the apparatus 200 can be implemented using general-purpose computers/processors with a computer program that, when executed, carries out any of the respective methods, algorithms, and/or instructions described herein. In addition, for example, special-purpose computers/processors, which can contain specialized hardware for carrying out any of the methods, algorithms, or instructions described herein, can be utilized.

The apparatus 200 can have an internal configuration of hardware, including a processor 202 and a memory 204. The processor 202 can be any type of device capable of manipulating or processing information. In some implementations, the processor 202 can include a central processing unit (CPU). In some implementations, the processor 202 can include a graphics processor (e.g., a graphics processing unit or GPU). For example, the GPU can provide additional graphical processing capability for at least one of pattern rendering, dose map optimization, mask-making simulation, substrate-manufacturing simulation, and applying freeform MRC to SRAF optimization based on ILT mask optimization. Although the examples herein are described with a single processor as shown, advantages in speed and efficiency can be achieved using multiple processors. For example, the processor 202 can be distributed across multiple machines or devices (in some cases, each machine or device can have multiple processors) that can be coupled directly or connected to a network. The memory 204 can be any transitory or non-transitory device capable of storing codes and data that can be accessed by the processor (e.g., via a bus). For example, the memory 204 can be accessed by the processor 202 via a bus 212. Although a single bus is shown in the apparatus 200, multiple buses can be utilized. The memory 204 herein can be a random-access memory (RAM) device, a read-only memory (ROM) device, an optical/magnetic disc, a hard drive, a solid-state drive, a flash drive, a security digital (SD) card, a memory stick, a compact flash (CF) card, or any combination of any suitable types of storage devices. In some implementations, the memory 204 (e.g., a network-based or cloud-based memory) can be distributed across multiple machines or devices. The memory 204 can store data 2042, an operating system 2046, and an application 2044. The data 2042 can be any data for processing (e.g., computerized data files or database records). The application 2044 can include programs that permit the processor 202 to implement instructions to perform functions described in this disclosure. For example, when the application 2044 is run, a set of algorithms, processes, or operations can be executed for dose map creation, dose map optimization, mask-making process simulation, substrate-manufacturing simulation, and applying freeform MRC to SRAF optimization based on ILT mask optimization.

In some implementations, in addition to the processor 202 and the memory 204, the apparatus 200 can include a secondary (e.g., additional or external) storage device 206. The secondary storage device 206 can provide additional storage capacity for high processing needs. The secondary storage device 206 can be a storage device in the form of any suitable transitory or non-transitory computer-readable media, such as a memory card, a hard disk drive, a solid-state drive, a flash drive, or an optical drive. Further, the secondary storage device 206 can be a component of the apparatus 200 or can be a shared device that can be accessed via a network. In some implementations, the application 2044 can be stored in whole or in part in the secondary storage device 206 and loaded into the memory 204. For example, the secondary storage device 206 can be used for long-term storage, such as a database.

In some implementations, in addition to the processor 202 and the memory 204, the apparatus 200 can include an output device 208. The output device 208 can be, for example, a display coupled to the apparatus 200 for displaying graphics data. If the output device 208 is a display, for example, it can be a liquid crystal display (LCD), a cathode-ray tube (CRT) display, or any other output device capable of providing a visible output to an individual. The output device 208 can also be any device capable of transmitting visual, acoustic, or tactile signals to a user, such as a touch-sensitive device (e.g., a touchscreen), a speaker, an earphone, a light-emitting diode (LED) indicator, or a vibration motor. In some implementations, the output device 208 can also function as an input device (e.g., a touchscreen display configured to receive touch-based input). For example, the output device 208 can include a display that can display images, simulation results, simulation parameters, or a combination thereof.

In some implementations, the output device 208 can also function as a communication device for transmitting signals and/or data. For example, the output device 208 can include a wired means for transmitting signals or data from the apparatus 200 to another device. For another example, the output device 208 can include a wireless transmitter using a protocol compatible with a wireless receiver to transmit signals from the apparatus 200 to another device.

In some implementations, in addition to the processor 202 and the memory 204, the apparatus 200 can include an input device 210. The input device 210 can be, for example, a keyboard, a numerical keypad, a mouse, a trackball, a microphone, a touch-sensitive device (e.g., a touchscreen), a sensor, or a gesture-sensitive input device. Any type of input device not requiring user intervention is also possible. For example, the input device 210 can be a communication device, such as a wireless receiver operating according to any wireless protocol for receiving signals. The input device 210 can output signals or data, indicative of the inputs, to the apparatus 200, for example, via the bus 212. For example, a user or operator can provide simulation-related information to the apparatus 200 via the input device 210. For another example, the input device 210 can also be an interface (e.g., a scanner) that can enable a user to provide images to the apparatus 200 related to the design pattern of the mask.

In some implementations, in addition to the processor 202 and the memory 204, the apparatus 200 can optionally include a communication device 214 to communicate with another device. Optionally, the communication can occur via a network 216. The network 216 can include one or more communications networks of any suitable type in any combination, including, but not limited to, Bluetooth networks, infrared connections, near-field connections (NFCs), wireless networks, wired networks, local area networks (LANs), wide area networks (WANs), virtual private networks (VPNs), cellular data networks, or the Internet. The communication device 214 can be implemented in various ways, such as a transponder/transceiver device, a modem, a router, a gateway, a circuit, a chip, a wired network adapter, a wireless network adapter, a Bluetooth adapter, an infrared adapter, an NFC adapter, a cellular network chip, or any suitable type of device in any combination that can communicate with the network 216. For example, the communication device 214 can connect to a mask maker via the network 216 to send the generated or optimized dose map to a multi-beam mask writer. For another example, the communication device 214 can also be connected to another computing device that includes an Electronic Design Automation (EDA) tool to generate a target substrate design based on one or more layers of the desired IC design. For another example, remote control instructions can be received by the communication device 214 from another computing device connected to the network 216 for remote control of the apparatus 200.

The apparatus 200 (and any algorithms, methods, instructions, etc., stored thereon and/or executed thereby) can be implemented as hardware modules, such as, for example, intellectual property (IP) cores, application-specific integrated circuits (ASICs), programmable logic arrays, optical processors, programmable logic controllers, microcode, firmware, microcontrollers, servers, microprocessors, digital signal processors, or any other suitable circuit. Further, portions of the apparatus 200 do not necessarily have to be implemented in the same manner.

Figure 3:
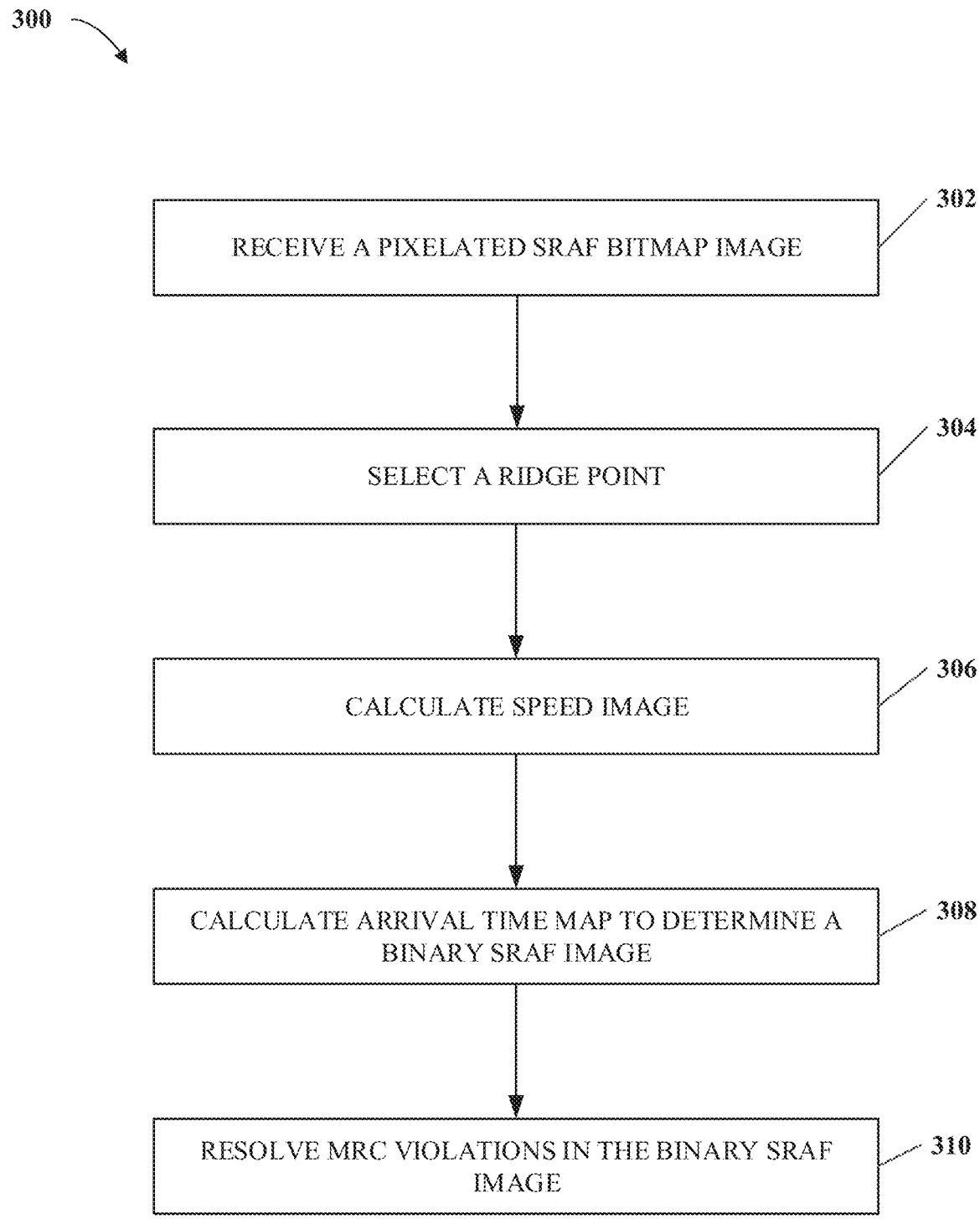
FIG. 3 is an example of a process for determining mask shapes according to an implementation of this disclosure.

FIG. 3 is an example of a process 300 for determining mask shapes according to an implementation of this disclosure. The process 300 can be implemented, in whole or in part, by a computing device, such as the example apparatus 200 of FIG. 2.

The process 300 can be used to determine shapes (i.e., SRAF shapes, main shapes, or both) for a mask, such as the mask 106 of FIG. 1. The process 300 receives an SRAF bitmap image from which one or more SRAF shapes and/or main shapes are extracted. The "pixelated SRAF bitmap image" is a bitmap that includes pixels corresponding to design shapes (i.e., main shapes) and pixels corresponding to SRAF shapes. However, the pixelated SRAF bitmap image includes no boundaries. That is, it is known a priori which pixels correspond to which design shapes and which pixels correspond to SRAF shapes.

The process 300 integrally incorporates at least some of the MRC rules into the extracting of the mask shapes (i.e., the SRAF shapes and/or the main shapes). By "integrally incorporating," it is meant that at least some of the MRC rules are incorporated into the shape extraction process, as opposed to the at least some of the MRC rules being applied/checked as a succeeding (or preceding) step, process, or phase to the shape extraction process.

The process 300 selects certain pixels that the process 300 assumes are in the center/middle of the shapes to be extracted. These assumed center/middle pixels are referred to as ridge points. From the ridge points, the process 300 expands outwards, in all directions, to determine (e.g., find) the pixels constituting the boundaries (i.e., boundary pixels) of the shapes. The boundary pixels are determined using arrival times as described below with respect to an enhanced fast marching method. The enhanced fast marching method is a fast marching method that incorporates MRC rules in its arrival time determination. The process 300 then extracts the polygons (i.e., the shapes) contoured by the boundary pixels.

At 302, the process 300 receives a pixelated SRAF bitmap image. The SRAF bitmap image can be a 2-dimensional bitmap of pixels. Each pixel has a corresponding brightness value (i.e., pixel value). In an example, the SRAF bitmap image can be generated from design shapes via, for example, a simulation process as described above. For example, the simulation process can receive the design shapes and produce a mask image that includes SRAF shapes. The process 300 is further explained below with reference to FIG. 4. For example, the SRAF bitmap image can be the result of an ILT process.

Figure 4:
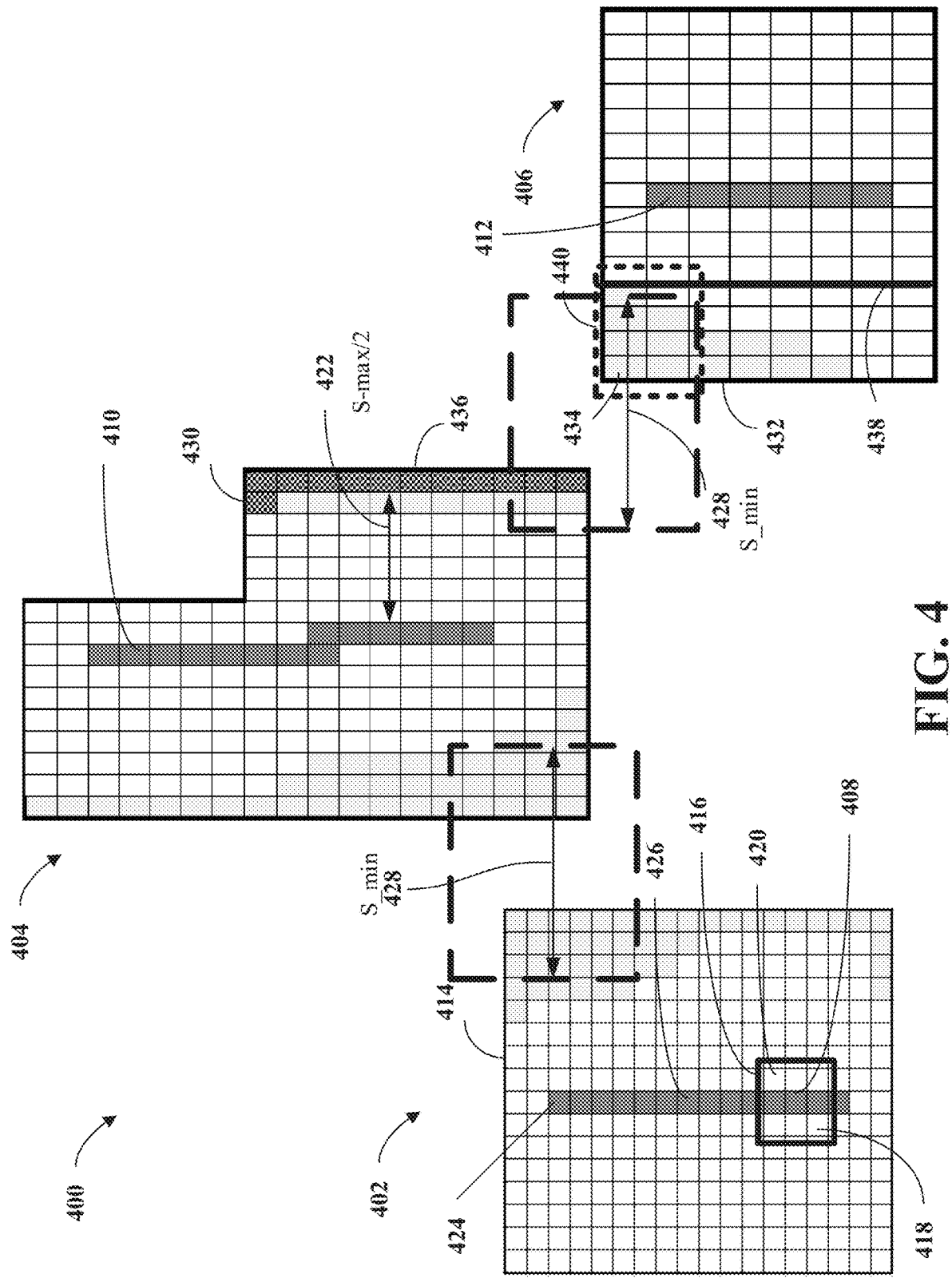
FIG. 4 illustrates an example of an SRAF bitmap image according to implementations of this disclosure.

FIG. 4 illustrates an example of an SRAF bitmap image 400 according to implementations of this disclosure. The SRAF bitmap image 400 includes pixels as further described below. The SRAF bitmap image 400 also shows that three polygons, namely polygons 402-406, are identified. The polygons can be identified by the process 300 or aspects thereof. As can be seen, each of the polygons 402-406 is shown as the outline of some of the pixels of the SRAF bitmap image 400. For simplicity, pixels of the SRAF bitmap image 400, which are not part of the identified polygons, are not shown in FIG. 4. The outlines of such pixels are not shown in the SRAF bitmap image 400; rather, white space is shown.

Returning to FIG. 3, at 304, the process 300 selects a ridge point. A ridge point is a pixel that is likely to be in the center of a polygon (i.e., shape) that is to be identified by the process 300. As such, at 304, a selected ridge point is not already identified as ridge point; however, it is a pixel that is likely to be a ridge point. In FIG. 4, the pixels 408-412 are selected at 304.

One or more pixels of the pixelated SRAF bitmap image can be selected as ridge points based on their intensities (i.e., brightness values). As described above, the pixelated SRAF bitmap image can be the result of a simulation of the mask manufacturing process. The simulation process simulates the physical process of exposing design shapes to light. To describe how the one or more ridge points are selected, a simplified and high-level description of the physics involved in generating the pixelated SRAF bitmap image process is now provided.

A mask corresponding to (i.e., used to print) a design pattern is generated. The mask can then be exposed to the light of an ebeam. The mask can be exposed to the light of an ebeam via a software simulation of the ebeam. In such a case, the mask can be a digital representation of a physical mask. Alternatively, the mask can be exposed to an actual physical ebeam. In such a case, the mask is a physical mask. A digital mask and a physical mask are collectively referred as a "mask."

The side of a small shape (i.e., a mask shape) can be very close to, or even smaller than, the wavelength of the ebeam light to which the shape is exposed, such as via simulation of an ebeam or a physical ebeam. For example, the ebeam light may be an ultraviolet light with a 193 nm wavelength, and one or more of the shapes may have sides that are less than 193 nm (e.g., 8 nm, 30 nm, etc.). Diffraction can result when a relatively long (as compared to the length of the side of a shape) wavelength light hits a smaller object. The diffraction can be in the form of a ripple, such that the highest intensity of the diffraction (zero order) results where the light hits and weakens at higher (i.e., first, second, etc.) orders of diffraction. Pixel "intensity" and "brightness" are used interchangeably herein.

Typically, the zero order corresponds to the design shape being printed (i.e., the main pattern). The locations of the other orders of diffraction can correspond to the locations of the SRAFs in the pixelated SRAF bitmap image or can be due to noise.

In an example, where main patterns are to be extracted, pixels corresponding to the zero order diffraction can be selected as ridge points.

In an example, where SRAF patterns are to be extracted, pixels corresponding to higher orders of diffraction are selected as ridge points. For example, the first order of diffraction locations can be used to select the ridge points. In another example, pixels corresponding to the first and second orders of diffraction locations can be used to select the ridge points. In an example, locations corresponding to orders of diffraction that are greater than the third order can be considered too weak or too remote and, accordingly, are not used for selecting ridge points. As mentioned above, SRAFs can be shapes that are invisible on the wafer, but they exist during the light exposure process to improve the accuracy (i.e., fidelity to the design patterns) of the printed wafer (i.e., the ICs).

In an example of selecting ridge points of SRAF shapes, design shapes can be overlaid onto the pixelated SRAF bitmap image. The pixel values of the pixels of the pixelated SRAF bitmap image that fall within the boundaries of the shapes are set to zero. For example, assume that a design shape (i.e., a rectangle) is to be printed using the wafer. The rectangle can be overlaid onto the pixelated SRAF bitmap image at the location where the shape is to be printed. The pixels that are contained within the shape are set to a value of zero. The brightest remaining pixel values can be selected as ridge points.

The brightest pixel values (i.e., the ridge points) can be selected in any number of ways. For example, the brightest pixel values can correspond to the pixels with pixel values that equal a first value (e.g., 255). For example, the brightest pixel values can correspond to pixels having the brightest values as a percentage of all the brightness values of the image (e.g., brightest 5%, 10%, or the like). For example, the brightest pixel values can correspond to the pixels having respective pixel values (i.e., brightness) that are greater than a threshold value (e.g., 245).

In an implementation, the process 300 can label the ridge points. For example, in a case where SRAF shapes are to be extracted, the process 300 can label (i.e., tag) the ridge points selected at 304 based on non-zero diffraction orders using a first ridge-points label (e.g., "SRAF Ridge Point"). For example, in the case that main shapes are to be extracted, the process 300 can label (i.e., tag) the ridge points selected at 304 based on zero diffraction orders using a second ridge-points label (e.g., "Main Ridge Point"). While string (e.g., textual) labels are used as an example, any other label can be used.

At 306, the process 300 calculates a speed image. The speed image can be calculated using the FMM. The speed image is to be used to calculate an arrival time map at 308. A brief description of the FMM and its use according to implementations of this disclosure is now given.

FMM is a computational technique for tracking a propagating interface in a space. As used herein, the term "interface" refers to a boundary for separating the inside and outside of an arbitrary region of space, and the term "propagation" refers to the motion of the interface. More specifically, the inside of a region of space refers to the inside of a shape (e.g., an SRAF or a main shape); and the outside of a region of space refers to the region that is not inside of the shape. An edge 414 of the polygon 402 is an example of an interface. The interface and the space can be of any number of dimensions. For example, in a three-dimensional (3D) space, the interface can be an enclosed surface. On a two-dimensional (2D) surface, the interface can be a contour curve.

A feature of FMM is that FMM propagates interfaces unidirectionally (or "monotonically"). That is, throughout the execution of the FMM, the interfaces are either always expanding outward or always contracting inward, but not both. For example, as the process 300 starts from ridge points (i.e., points on center lines of shapes), the interfaces are expanded outwardly, as further described below.

Applying FMM to a pixelated SRAF bitmap image, such as the SRAF bitmap image 400, and starting at selected ridge points, such as the pixels 408-412, the "space" can be the pixelated SRAF bitmap image itself, and the interfaces can be the boundaries (i.e., segments or edges) between regions of the mask image (e.g., between a bright region and a dark region). The FMM can be used for contour extraction of shapes of the mask image. The extracted boundaries can be formed into polygons. The polygons can serve as the extracted mask patterns (e.g., main patterns or SRAF patterns, as the case may be).

To describe the propagation of the interface, a description of a velocity of the interface is used in FMM. For convenience, a parameter F (e.g., a scalar-value parameter) can be used to describe the velocity of the interface in a normal direction of the interface (referred to as a "normal velocity"). F can be referred to as a "propagation speed" (or "speed" for simplicity). For the first type of propagation, F can constantly satisfy a condition of F>0 (for monotonical expansion of the interface) or F<0 (for monotonical contraction of the interface). The speed F can be used to calculate 306 the speed image of FIG. 3.

The speed function can be related to the intensity of a pixel. In an example, the speed function can be related to a power a (e.g., a=2) of the intensity. That is, the speed function F and the intensity I (i.e., brightness) can be related by: $F=f(I^a)$. In situations where it is desired to block light when printing a mask, the speed can be related to the inverse of the power of the intensity. In situations where it is desired to not block light, a proportional (i.e., as opposed to an inversely proportional) relationship can be used. In another example, the speed can be related to the logarithm of the intensity or the Gaussian of the intensity. Other relationship between the intensity and the speed function are possible.

If a pixel is outside, but near, a region (e.g., an SRAF shape or a main shape), then the pixel's intensity is either zero, close to zero, or can be attributed to noise. Accordingly, the speed for the pixel is low, and the arrival time associated with the pixel is very high. A speed threshold can be used such that if the brightness of a pixel is very low (such as due to noise), the speed of the pixel can be assumed to be zero. In an example, the speed threshold can be determined as a percentage. For example, the lowest 10% of the pixel speeds can be set to zero. In another example, the speed threshold can be provided as a configuration. For example, a user can provide the speed threshold. In another example, the speed threshold can be based on the average pixel intensity in the SRAF bitmap image.

In another example, instead of, or in addition to, providing a speed threshold, an arrival-time threshold can be used. For example, if the arrival time for a pixel exceeds an arrival threshold, the arrival time for the pixel can be set to a very high value (e.g., infinity).

The speed function is a cost function that can be roughly interpreted as answering the question: For a pixel and a ridge point, is the pixel inside or outside a shape having the ridge point as a ridge point?

The propagation of the interface can start from an initial position, such as, for example, an initial contour or an initial point (referred to as a "ridge point"). That is, when the time is at zero, the interface is at the initial position. To determine the time (referred to as an "arrival time") for the interface to propagate to (e.g., reach or sweep across) a point in the region, a relationship between the speed F and the arrival time can be used:

$$|\nabla T|F=1 \quad \text{Eq. (1)}$$

Eq. (1) is known as the Eikonal equation, which is a form of the more generic Hamilton-Jacobi equations. The T in Eq. (1) can be referred to as a "propagation arrival time" or "arrival time" for simplicity.

The objective of FMM is to solve Eq. (1) and obtain the arrival time T for points (i.e., pixels) in the space in which the interface propagates. For any given point (x, y) on a surface, T(x, y) can give the time for the interface to propagate to the point (x, y) from the initial position (e.g., a ridge point). For an image, each point (e.g., a pixel) of the image can be associated ("tagged" or "labeled") with a computed arrival time, and the set of $\{T(x, y)\}$ for the points $\{(x, y)\}$ in the image can be referred to as an "arrival time map" that maps a coordinate of a point in the image to the arrival time associated with that point. The contour extraction of the image can become a look-up operation of the propagating contour based on the coordinates of the points $\{(x, y)\}$ and the arrival time map $\{T(x, y)\}$. For example, if a threshold $T_{th}$ is applied to the T(i, j) associated with a ridge point (i, j), which means the contour propagating from the ridge point (i, j) stops at time $T_{th}$, the "frozen" contour at the time $T_{th}$ can be the extracted contour associated with the ridge point (i, j).

It is to be noted that a pixel can be associated with multiple speed values, each corresponding to a ridge point. Given a ridge point at location (i, j), the value of the speed of a pixel at location (x, y) can be denoted by $F_{i,j}(x,y)$. In addition to being tagged with a speed value with respect to a ridge point, a pixel can also be tagged with a distance from the ridge point. As such, a pixel can be tagged with multiple distances, each corresponding to a ridge point. The value of a distance of a pixel at location (x, y), denoted $D_{i,j}(x,y)$, is the distance between the pixel at (x, y) and the corresponding ridge point at (i, j). Similarly, a pixel at location (x, y) can be tagged with multiple arrival times. Each of the arrival times is associated with a starting point (i.e., a ridge point). The value of the arrival time at pixel location (x, y) with respect to a ridge point at (i, j) is denoted $T_{i,j}(x, y)$.

At least some MRC rules can be incorporated into the speed function. For example, to avoid side lobe printing, an MRC rule can be such that "the width (height) of an SRAF polygon must be less than a maximum size (e.g., S_max)." That is, for example, a distance 422 of FIG. 4, which is the distance between a ridge point to a pixel that is at the edge of the polygon 404, cannot be greater than S_max/2. As such, the speed function can set a large arrival time (e.g., infinity) for pixels that are greater than S_max/2 away from the ridge point. That is, the arrival time of a pixel can be set to a large value (e.g., infinity) based on a comparison of the distance between the pixel and the ridge point to the maximum shape size. Using the ridge point labels, the respective MRC rule can be used. For example, main shapes can be wider than SRAF shapes. Accordingly, an MRC rule can specify a first S_max value for SRAF shapes and a second S_max value for main shapes.

An example of an MRC rule that cannot be incorporated into the speed function is the corner-to-corner rule, which is illustrated with respect to minimum corner distance (e.g., S_min) 428 of FIG. 4 and explained further below.

Returning to FIG. 3, at 308, the process 300 calculates an arrival time map. From the arrival time map, the process 300 determines a binary SRAF image. As used in this disclosure, "determine" means to create, form, produce, select, construct, identify, specify, generate, or otherwise determine in any manner whatsoever. At 310, the process 300 resolves MRC violations in the binary SRAF image. That is, the process 300 determines whether any MRC rule is violated in the binary SRAF image and corrects the violation. MRC violations are corrected by adjusting pixel values of the pixels of the binary SRAF image. Resolving 310 the MRC violations is explained further below with respect to FIG. 7.

Figure 5:
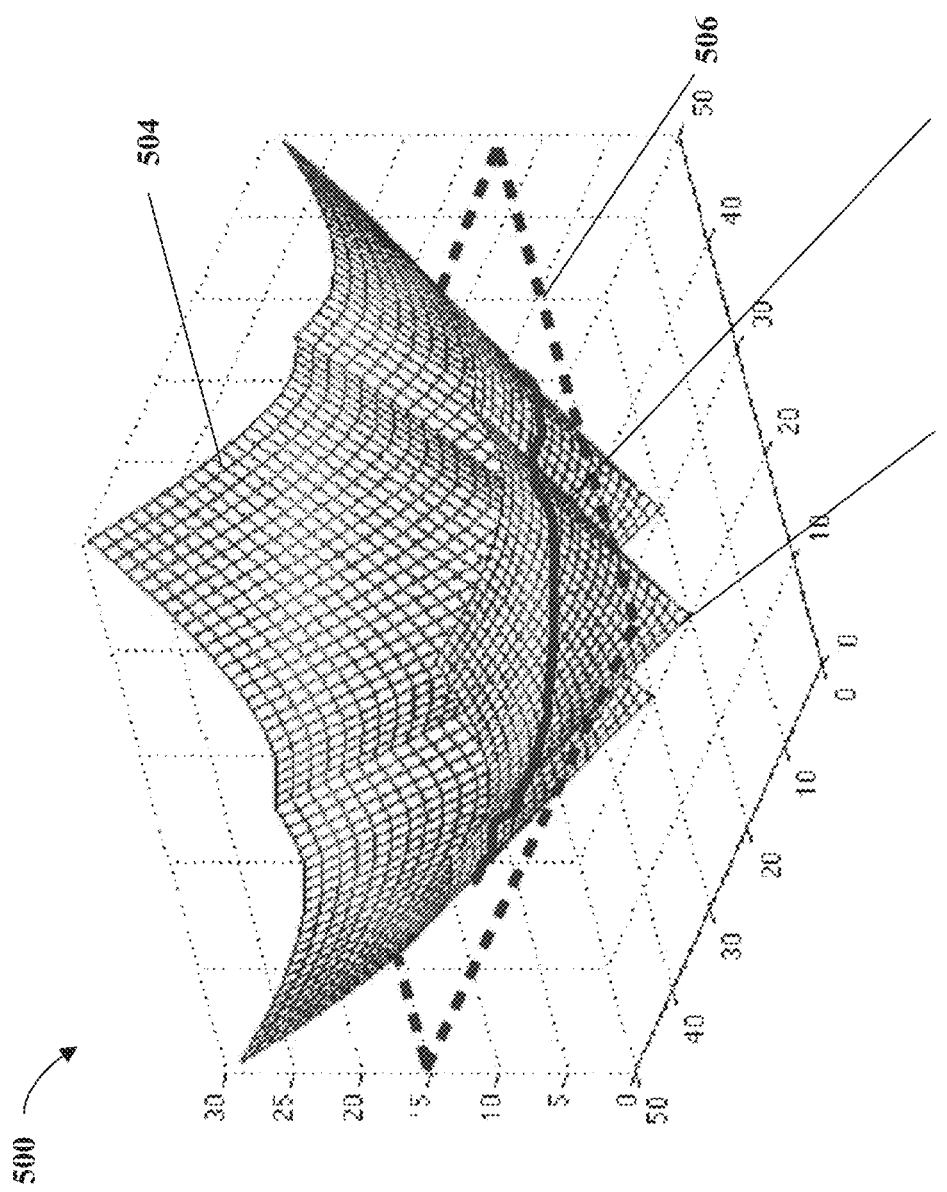
FIG. 5 is a diagram of an example arrival time map according to implementations of this disclosure.

FIG. 5 is a diagram of an example arrival time map 500 according to implementations of this disclosure. To start the FMM operation, such as by calculating 308 of the process 300, a ridge point 502, such as the pixels 408-412 of FIG. 4, can be selected.

After the ridge point 502 is determined, the FMM can be implemented to generate an arrival time map 504 associated with the ridge point 502. An arrival time of zero can be associated with the ridge point 502. The arrival time map 504 can be illustrated in a 3D coordinate system. In FIG. 5, the x-y plane represents the 2D pixelated optimized mask pattern. Each pixel of the optimized mask pattern can have a coordinate value pair (x, y) that represents its location in the x-y plane. The ridge point 502 is on the x-y plane. The z-axis can represent arrival time values. That is, a slice of the z-axis (i.e., a z value that is equal to a specified arrival time value) can provide a list of all the pixels corresponding to the specified arrival time value. That is, the arrival time values of the arrival time, with respect to a particular ridge point, can be plotted in the x-y-z space, which can form the arrival time map 504.

After the arrival time map 504 is determined, an arrival-time threshold 506 (hereinafter referred to as a "threshold" for simplicity) can be applied to determine the binary mask pattern. For example, the arrival-time threshold 506 may be an arrival time of 3 hours.

The arrival-time threshold 506 can be represented as an intersecting plane shown in dashed lines in FIG. 5. The intersecting plane can be parallel to the x-y plane. The arrival-time threshold 506 can intersect the arrival time map 504 at a contour 508 (not fully shown). The binary mask pattern can be determined as the contour 508. For example, the arrival times in the arrival time map 504 can have values ranging from a first number (e.g., 0) to a second number (e.g., 1), and the arrival-time threshold 506 can be selected as a third number (e.g., 0.5). Any pixel in the optimized mask pattern having an arrival time smaller than or equal to the third number can be deemed as being within the optimized mask pattern. Any pixel having an arrival time greater than the third number can be deemed as being outside the optimized mask pattern. The binary mask pattern can be determined as pixels having an arrival time equal to the third number.

Figure 6:
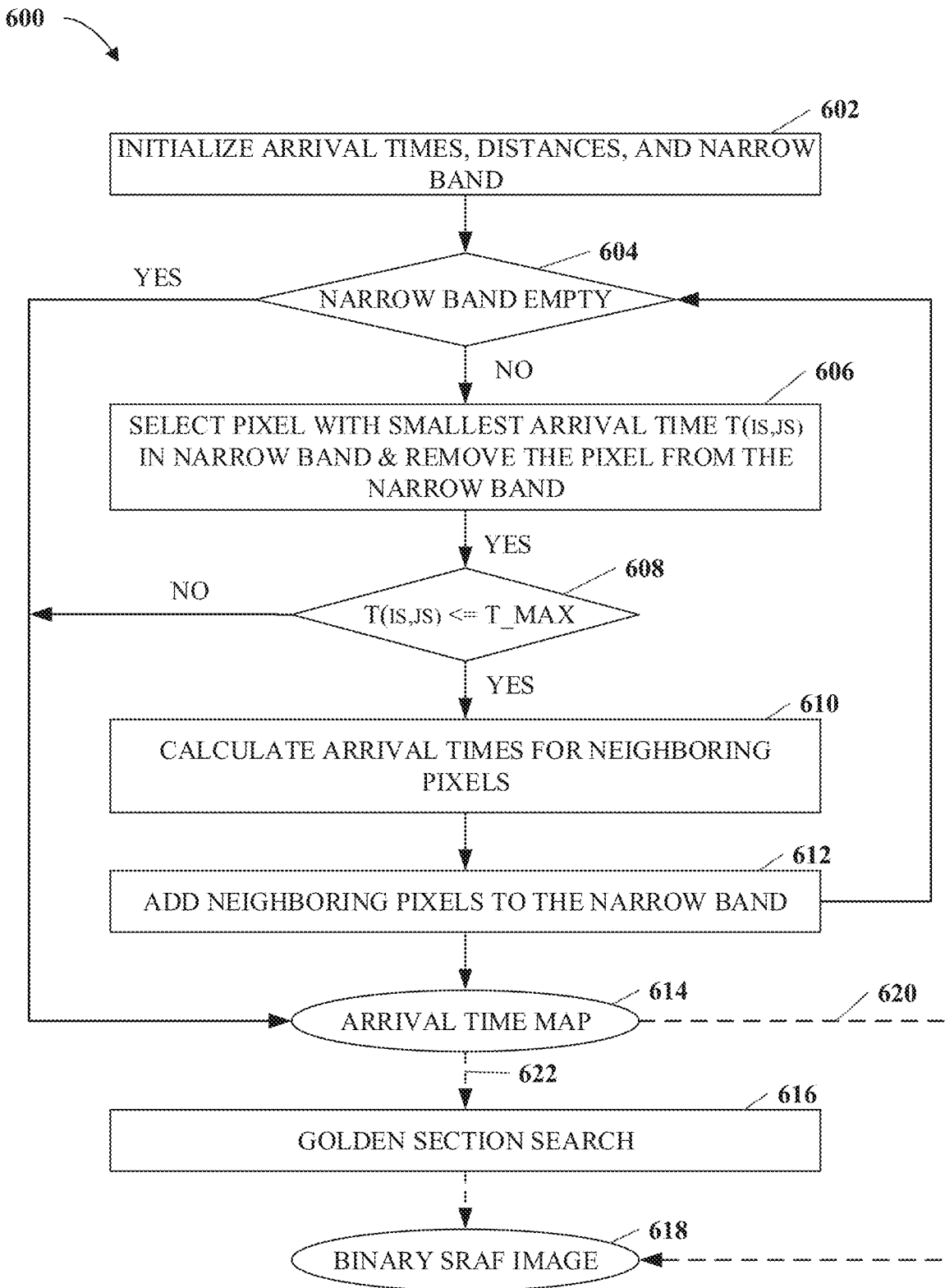
FIG. 6 is an example of a process for calculating an arrival time map according to implementations of this disclosure.

FIG. 6 is an example of a process 600 for calculating an arrival time map according to implementations of this disclosure. The process 600 can be used at 308 of FIG. 3 to calculate the arrival time map. The process 600 can be executed by an apparatus, such as the apparatus 200 of FIG. 2.

For simplicity of explanation, the process 600 is described with respect to one ridge point. However, it is to be understood that the process 600 can be performed with respect to each ridge point in an SRAF bitmap image ("image" for simplicity), such as the SRAF bitmap image 400 of FIG. 4. For example, the process 600 can be performed simultaneously using more than one ridge point, such as all ridge points that can be selected at 304 of the process 300.

The process 600 can use a target arrival time. The target arrival time can be used to select those pixels of the SRAF bitmap image (or, simply, image), such as the SRAF bitmap image 400 of FIG. 4, having arrival times that are smaller than the target arrival time. The unit of measure of the target arrival time is related to the selected unit of measure of the speed function described above. For example, if the speed function has a unit of measure of meters/hours, then the target arrival time can be a value in hours (and minutes). For example, a target arrival time can be three (3) hours. In an example, the target arrival time can be a configuration of, or an input to, the process 600.

The process 600 can also use a threshold arrival time (i.e., T_max). The threshold arrival time (T_max) can be provided as a configuration to the process 600. In an example, the process 600 can receive the threshold arrival time, T_max, from a user (e.g., an operator of the apparatus 200). The threshold arrival time, T_max, can be used to stop processing additional pixel locations, as further described below. The threshold arrival time (T_max) is an arrival time that can be assumed to be an arrival time too remote from ridge points. As such, pixels having arrival times that exceed T_max are likely to be pixels outside shapes of the ridge point. In some examples, T_max can be selected as a function of the target arrival time. For example, the threshold arrival time, T_max, can be set to a multiplier X of the target arrival time, where X is an integer that is greater than or equal to 1 (i.e., X≥1). For example, X can be 2, 3, or any other value.

The process 600 proceeds pixel-by-pixel from the ridge point. For a pixel, the process 600 considers the pixel's neighbors and calculates the arrival times at the neighboring pixels using the speed image (i.e., the speed function).

At 602, the process 600 initializes the arrival times, distances, and a narrow band with respect to the ridge point. For example, the ridge point can be the pixel 408 of FIG. 4. The ridge point can be designated as pixel (i, j).

Initializing the arrival times can include setting the arrival time for the ridge point to 0: $T_{i,j}(i,j)=0$. Initializing the arrival times can also include setting the arrival times for each pixel at location (x, y), other than location (i, j) (i.e., other than the ridge point), within a region of the image to a first initial value (e.g., −1): $T_{i,j}(x,y)=-1$, for all locations (x, y) within the region of the image. The region of the image can be the whole image itself. Alternatively, the region of the image can be a region of the image that is substantially co-extensive with a largest possible shape based on the ridge point label. For example, if the ridge point is an "SRAF Ridge Point," then the region can be substantially co-extensive with a largest SRAF polygon according to the MRC rules. In an example of selecting the region of the image, the ridge point is assumed to be the center point of an SRAF polygon, and a region around the center point is considered as the largest polygon size (in pixels). For example, regardless of the actual location on the ridge point (e.g., the pixel 408) on the ridge line (e.g., a ridge line 424) of a shape (e.g., the polygon 402), the ridge point is assumed to be at the center of the shape (e.g., the center pixel 426) for the purpose of determining the region of the image.

Initializing the distances can include setting the distance of the ridge point (i.e., the distance from the ridge point to itself) to zero: $D_{i,j}(i,j)=0$. Initializing the distances can also include setting the distances for each pixel at location (x, y), other than the location (i, j), within the region of the image to a second initial value (e.g., −1): $D_{i,j}(x,y)=-1$, for all (x, y) within the region of the image.

The narrow band constitutes the pixels pending evaluation (i.e., the pixels for which the arrival times are to be computed). The neighboring pixels of a pixel under current consideration are added to the narrow band. Initially (i.e., at 602), the ridge point is the pixel under consideration. Accordingly, the neighboring pixels of the ridge point are added to the narrow band. For example, the neighboring pixels of the pixel 408 (i.e., the ridge point) are those pixels inside a window 416 around the pixel 408. That is, the neighboring pixels are the eight pixels around the pixel 408, including the neighboring pixels 418-420.

The arrival times for the neighboring pixels are calculated. That is, for each neighboring pixel at (x, y) (e.g., the neighboring pixels 418, 420), the arrival time is calculated as $T_{i,j}(x,y)=1/F_{i,j}(x,y)$, where $F_{i,j}(x,y)$ is the speed function for the pixel at (x, y) with respect to the ridge point (i, j). Additionally, the distances of the neighboring pixels are set to 1 (i.e., one pixel, or one unit of measure, away from the ridge point), $D_{i,j}(x,y)=1$.

At 608, the process 600 determines whether the narrow band is empty. If so, the process 600 proceeds to 614; otherwise, the process proceeds to 610. The narrow band becomes empty when there are no additional pixels to consider.

At 606, the process 600 selects the pixel with the smallest arrival time $T_{i_s,j_s}$ in the narrow band and removes the pixel from the narrow band. That is, the process 600 follows the shortest path. For example, if the two smallest arrival times of the neighboring pixels of the ridge point (i.e., the pixel 408) are those associated with the neighboring pixels 418 and 420, and if that the arrival times associated with the neighboring pixels 418 and 420 are, respectively, 3 and 5 units of measure (e.g., hours, minutes, or whatever the unit of measure selected for the arrival time may be), then the process 600 selects the neighboring pixel 420 at 606 and removes the neighboring pixel 420 from the narrow band.

At 608, if the smallest arrival time removed from the narrow band (i.e., $T_{i_s,j_s}$) is greater than the threshold arrival time T_max, then the process 600 proceeds to 614 and stops processing additional pixel locations even if the narrow band is not empty; otherwise, the process 600 proceeds to 610. That is, at 608, if the smallest arrival time is already greater than the threshold arrival time T_max, then there is no sense in considering the neighboring pixels of the pixels in the narrow band because they are sure to have arrival times that exceed the threshold arrival time T_max.

At 610, the process 600 calculates arrival times for the neighboring pixels of the pixel selected at 606. That is, the process 600 calculates an arrival time for each of the neighboring pixels (i.e., the pixels in a window, such as those described with respect to the window 416) that has not already been tagged with an arrival time with respect to the ridge point. That is, for a neighboring pixel at location (x, y), the process 600 calculates $T_{i,j}(x, y)$. The process 600 also assigns a distance to the pixel at (x, y): $D_{i,j}(x, y)=T_{i_s,j_s}+1$. That is, the distance of the neighboring pixel is set as one unit of measure (e.g., 1 pixel) further away from the ridge point than the pixel selected at 606. As such, the process 600 tags at least some of the neighboring pixels with respective arrival times at 610.

At 610, the process 600 can use MRC rules in the calculating of $T_{i,j}(x, y)$. For example, some intra-shape rules can be used. For example, if the ridge point is classified (i.e., tagged) as a "Main Ridge Point," then the "SRAF maximum size" rule can be used. For example, if a pixel's distance $D_{i,j}(x, y)$ is greater than the (SRAF maximum size)/2 (e.g., the distance 422, S_max/2, of FIG. 4), the arrival time $T_{i,j}(x, y)$ at the pixel can be set to a large arrival time (e.g., infinity). For example, if an MRC rule indicates that "the maximum SRAF edge size is 12 nm," then the arrival times of pixels having a distance $D_{i,j}(x, y)$ of 12/2=6 or greater (i.e., remote pixels) can be set to a large value. The dark-filled pixels 430 of FIG. 4 illustrate that the arrival time of the dark-filled pixels 430 is set to a large number because they are further than S_max/2 away from ridge points.

Alternatively, the speed function of the remote pixels can be set to zero a priori, or the arrival time can be set to a large value a priori. For example, the speed function for remote pixels can be set at 306 of the process 300.

At 612, the neighboring pixels for which arrival times are calculated at 610 are added to the narrow band. The process 600 returns to 604 to determine whether the narrow band is empty.

When the process 600 reaches 614, pixels of the image are already labeled with arrival times (i.e., by 604 and 610). As such, the set of the arrival times of the pixels constitutes an arrival time map, such as the arrival time map 504 of FIG. 5. The target arrival time described above can be used to select the pixels having arrival times that are smaller than the target arrival time.

In an implementation, illustrated by a dashed path 620, the process 600 can proceed from 614 to 618. As such, the binary SRAF image obtained at 614 is the result (i.e., output) of the process 600. In another implementation, illustrated by a dashed path 622, the process 600 can proceed to 616 to perform a golden section search. The result of the golden section search at 616 becomes the result of the process 600.

For example, at 614, the target arrival time is used to generate a binary SRAF image (i.e., a first binary SRAF image). At 616, variations of the arrival time can be used to generate additional binary SRAF images (i.e., mask images). Any number of variations of the arrival time can be used. As such, a plurality of mask images (including the first binary SRAF image) are generated. The one of the plurality of the mask images that results in the smallest error can be selected as the binary SRAF image at 618. The error can be calculated based on the EPE. For example, the error can be the sum of the EPE squared. The EPE is a measure of the error variance between the design patterns and the wafer image. The EPE can be determined as a difference between intended and printed features in an IC layout. The EPE is a shape error that measures normal distances (i.e., distances measured in directions perpendicular to edges) from edges of a design pattern to a point on the substrate pattern. The normal distances can have positive values or negative values. For example, a positive or negative value of a normal distance can represent that the corresponding point on the substrate pattern is outside or inside the design pattern, respectively, or vice versa. The EPE can be a scalar value determined based on values of the normal distances. The EPE can indicate similarity between the design pattern and the substrate pattern. For example, the smaller the EPE value is, the greater the similarity is between the substrate pattern and the design pattern.

Generating additional binary SRAF images can depend on whether previously generated binary SRAF images meet an EPE threshold (i.e. an error threshold). For example, if an additional binary SRAF image, generated at 616, does not meet the EPE threshold, then the process 600 can generate additional binary SRAF images.

For example, if the target arrival time is 3 hours, then a second binary SRAF image can be generated using a second arrival time of 2 hours and 15 minutes, and a third binary SRAF image can be generated using a third arrival time of 4 hours. For each of the first binary SRAF image, the second binary SRAF image, and the third binary SRAF image, shapes are extracted to generate, respectively, a mask, a second mask, and a third mask.

Additional variations of the arrival time can be determined based on the golden-section search technique (i.e., by narrowing the range of the target arrival times), as can be appreciated by a person skilled in the art.

In an example, the process 600 can select variations of the target arrival time according to the formula (target arrival time±nA), where n is an iteration number and A is a unit of time. For example, A can be 1 hour, 15 minutes, or any suitable unit of time appropriate for the speed function. For example, if A=15 minutes and the target arrival time is 3 hours, then in a first iteration at 616, the arrival time is set, respectively, to 3 hours and 15 minutes and 2 hours and 45 minutes.

A technique for determining the EPE for a mask image of the plurality of mask images is now described. However, other techniques can be available.

First, a mask is generated. Polygons are extracted from the mask image. Using the arrival times of the pixels of the mask image and the arrival time used to generate the mask image, which pixels belong to which polygons can be known: the pixels that are within the arrival time from the ridge point are the pixels that are within (or at the edges of) the polygon having the ridge point as ridge point. In an example, a convex hull algorithm, or any other algorithm, can be used to determine the polygons using the pixels that are determined to be part of the polygon.

Second, the mask is exposed (i.e., in simulation space) to the optics of an ebeam. That is, the mask shapes can be dithered into a new mask image, which is then exposed into an optical image on top of a resist image. The resist image can then be turned into a wafer image.

Third, the wafer image can be compared to an image of the desired design patterns to calculate the EPE.

Figure 7:
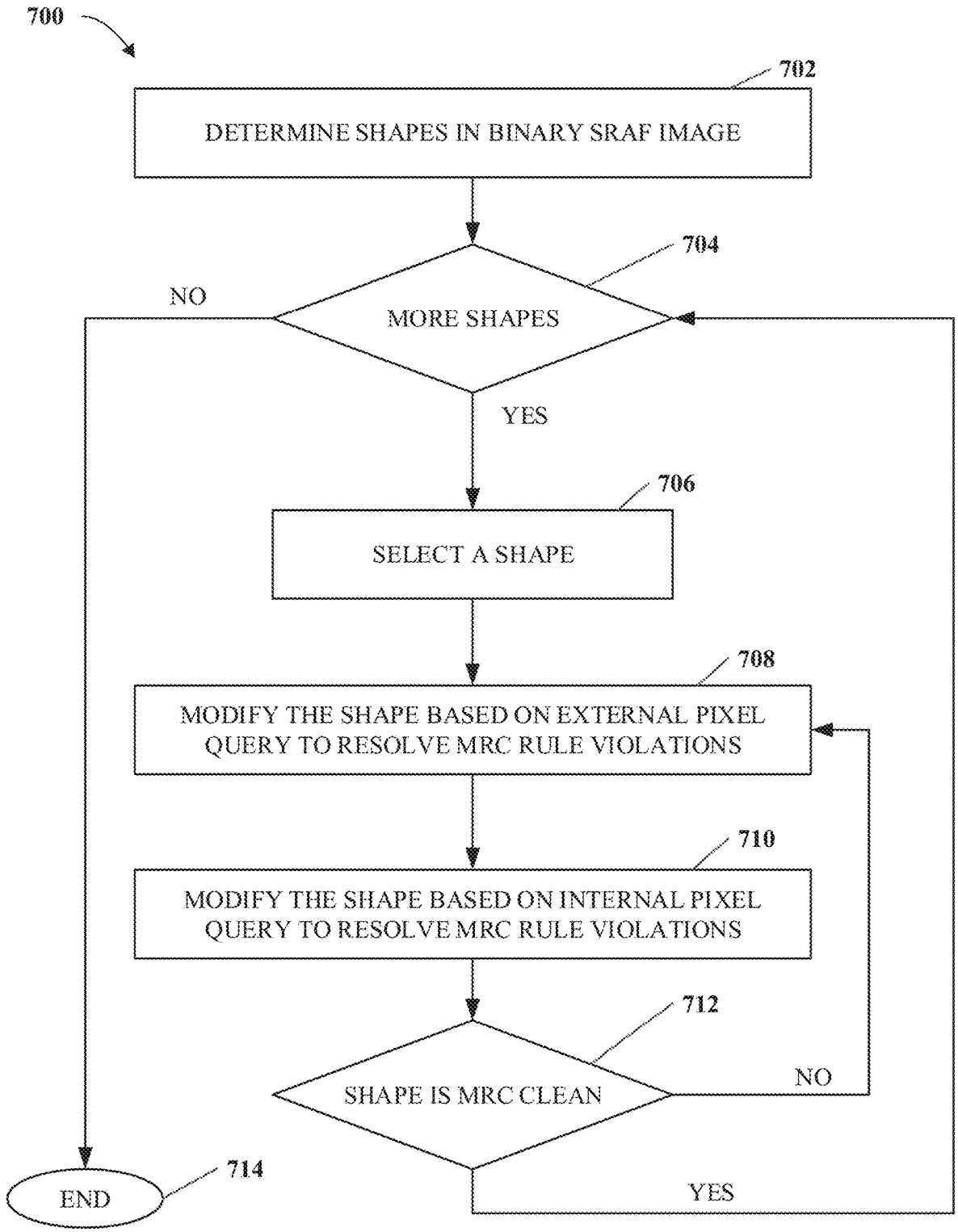
FIG. 7 is an example of a process for resolving MRC violations in a binary SRAF image according to implementations of this disclosure.

FIG. 7 is an example of a process 700 for resolving MRC violations in a binary SRAF image according to implementations of this disclosure. The binary SRAF image can be a binary SRAF image generated (i.e., calculated, determined, etc.) by the process 600 of FIG. 6. The process 700 results in MRC-cleaned SRAF polygons. That is, the process 700 results in mask polygons that do not violate at least some MRC rules.

In some implementations, the process 600 can include performing the process 700, or one or more of the operations of the process 700, for each binary SRAF image generated by the process 600, such as by performing a golden section search at 616. As such, prior to calculating the EPE for a binary SRAF image, the process 600 can resolve MRC violations in the binary SRAF image, resulting in a resolved binary SRAF image, and calculate the EPE based on the resolved binary SRAF image. In such situations, the process 300 may not include resolving 310 MRC violations.

It may not be possible to incorporate some of the MRC rules into the speed function F and/or in the determining of the arrival time map described above. For example, since shapes (i.e., polygons) cannot be known until a binary SRAF image that meets an arrival time criterion (e.g., the target arrival time), MRC rules that are polygon-related cannot be evaluated until a binary SRAF image is determined. For example, a corner-to-corner rule, as described with respect to the minimum corner distance 428 (S_min), cannot be evaluated (i.e., to determine whether it is violated or not) until the polygons 404-406 are determined. As such, a binary SRAF image determined by the process 600 may include MRC violations. That is, some MRC rules may be violated (i.e., not met, not satisfied, etc.) in the binary SRAF image determined by the process 600. The process of resolving MRC violations can be referred to as "MRC cleaning."

For each of the shapes, the process 700 determines whether any inter-shape MRC rules are violated and corrects those violations. The process 700, using external pixel queries as described below, determines whether any inter-shape MRC rules are violated. For each of the shapes, the process 700 also determines whether any intra-shape MRC rules are violated and corrects those violations. The process 700, using internal pixel queries as described below, determines whether any intra-shape MRC rules are violated.

In the process of correcting an MRC violation for a shape, other MRC rules may be violated. As such, the process 700 iteratively determines whether inter-shape and intra-shape MRC violations exist for a shape.

At 702, the process 700 determines the shapes (i.e., the polygons) of the binary SRAF image. In an example, the shapes may already have been identified, such as, for example, by the process 600 for determining the EPE for the binary SRAF image. As such, the process 700 uses the already identified shapes.

Determining the shapes can include determining (e.g., identifying) the edges of the shapes. In turn, identifying the edges can also include determining the pixels constituting the edges. For example, and referring to FIG. 4, the polygon 406 can be identified as a shape; an edge 432 can be identified as an edge of the polygon 406; a pixel 434 can be identified as an edge pixel of the edge 432 and/or the polygon 406; and an edge 436 can be identified as an edge of the polygon 404.

Determining the shapes can also include determining ridge lines for the shapes. For example, a collection of adjacent ridge points can be used to identify shape ridge lines, such as the ridge line 424 of FIG. 4. A ridge line forms a "center" segment of a shape and is parallel to the longer edges of the shape. For shapes that are square or substantially square, such as the polygons 402 and 406, either a vertical or a horizontal ridge line may be identified. In another example, ridge lines for SRAF shapes can be identified according to the closest design shape(s) that are neighbors to the SRAF shapes.

In an implementation, identifying a shape, an edge, and/or a pixel can include classifying the shape, the edge, and/or the pixel. For example, a shape can be classified as an SRAF or a main shape. For example, the edge can be classified based on its orientation or location (e.g., top, right, bottom, left). For example, a pixel can be classified as corner, edge, internal, etc. A pixel can have multiple classes. For example, a pixel can be both a corner pixel and an edge pixel. In an implementation, the classes can be represented by a bitmask. Each position of the bitmask represents a class. In a simple example, the bitmask can include two positions: a first position indicating that the pixel is an edge pixel and a second position indicating that the pixel is a corner pixel. As such, the mask "11" indicates that the pixel is both an edge pixel and a corner pixel; the mask "10" indicates that the pixel is an edge pixel but not a corner pixel. Other implementations of classifications are possible.

At 704, the process 700 determines whether there are more shapes to be checked. If so, then the process proceeds to 706 to select one of the remaining shapes; otherwise, the process terminates at 714. At 706, a shape is selected for which MRC rule violations are to be repaired (i.e., resolved).

At 708, the process 700 modifies the shape based on external pixel query to resolve MRC rule violations. In an implementation, modifying 708 the shape can include performing an external pixel query, determining MRC violations based on the external pixel query, and modifying the shape to resolve the violations. Modifying the shape can mean modifying the shape itself, modifying adjacent shapes, modifying the shape and an adjoining shape, or modifying an adjacent shape without modifying the shape itself.

Performing the external pixel query can include iterating over boundary pixels, such as each boundary pixel, of the shape to determine whether the boundary pixel violates an MRC rule. FIG. 4 is now used to illustrate an example.

For example, the pixel 434 violates the minimum corner-to-corner rule. As such, the process 700 modifies at least one of the polygons 404 and 406 to remove the violation. For example, the process 700 can move the edge of the polygon 406 to an edge 438 and set the brightness of the pixels between the edge 432 and the edge 438 to zero. As can be seen, the edge 432 is moved by 4 pixels. In another example, the edge 432 of the polygon 406 can be moved inward by two pixels, and the edge 436 of the polygon 404 can be moved inward by two pixels. As such, the process 700 modifies two polygons to eliminate the MRC violation. In yet another example, instead of moving the whole of the edge 432, the process 700 can remove from the polygon 406 and/or the polygon 404 only those pixels that violate the MRC rule (e.g., the pixels inside a window 440 of the polygon 406). As such, only eight pixels are removed, and the edge 432 is adjusted to become a segmented edge. As a person skilled in the art can appreciate, there are many ways of modifying polygons and/or polygon segments.

At 710, the process 700 modifies the shape based on an internal pixel query to resolve MRC rule violations. In an implementation, modifying 710 the shape can include performing an internal pixel query, determining MRC violations based on the internal pixel query, and modifying the shape to resolve the violations. Modifying the shape can mean modifying the shape itself, modifying adjacent shapes, modifying the shape and an adjoining shape, or modifying an adjacent shape without modifying the shape itself.

Performing the internal pixel query can include iterating over boundary pixels, such as each boundary pixel, of the shape to determine whether the boundary pixel violates an MRC rule. The boundary pixels used at 710 are the boundary pixels resulting from the modifying 710 of the shape. For example, by adjusting an edge of a polygon inwardly at 708, the size of the polygon is thereby made smaller. As such, a minimum-shape-size MRC rule may now be violated, whereas the polygon did not violate the rule prior to adjusting the edge. In an example of repairing (i.e., resolving) the violation, the shape can be expanded to meet the minimum size, and an adjacent polygon can be shrunk by a similar amount. For example, if the edge of the shape is moved outwardly by 2 pixels, the edge of an adjacent shape is moved inwardly by 2 pixels. In another example, if the shape is an SRAF polygon, then the shape can be removed altogether. Again, "remove" as used herein means that the pixel values of the removed pixels are set to zero intensity. As a person skilled in the art can appreciate, there are many ways of modifying polygons and/or polygon segments.

At 712, if the shape still includes MRC violations (i.e., the shape is not MRC-clean), the process 700 returns to 708; otherwise, the process 700 proceeds to 704 to select another shape, if any.

At the completion of the process 700, an MRC-cleaned mask is obtained. The MRC-cleaned mask can include main pattern polygons and SRAF polygons. In an example, as described above with respect to diffraction orders greater than zero, the MRC-cleaned mask can include only SRAF polygons. The MRC-cleaned mask can then be simulated as described above.

For simplicity of explanation, the processes 300, 600, and 700 are each depicted and described as a series of steps or operations. However, the steps or operations in accordance with this disclosure can occur in various orders and/or concurrently. Additionally, other steps or operations not presented and described herein may be used. Furthermore, not all illustrated steps or operations may be required to implement a technique in accordance with the disclosed subject matter.

As described above, it should be noted that all or a portion of the aspects of the disclosure described herein can be implemented using a general-purpose computer/processor with a computer program that, when executed, carries out any of the respective techniques, algorithms, and/or instructions described herein. In addition, or alternatively, for example, a special-purpose computer/processor, which can contain specialized hardware for carrying out any of the techniques, algorithms, or instructions described herein, can be utilized.

The implementations of apparatuses as described herein (and the algorithms, methods, instructions, etc., stored thereon and/or executed thereby) can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing, either singly or in combination. The terms "signal" and "data" are used interchangeably. Further, portions of the apparatuses do not necessarily have to be implemented in the same manner.

The aspects of the disclosure described herein can be described in terms of functional block components and various processing operations. The disclosed processes and sequences can be performed individually or in any combination. Functional blocks can be realized by any number of hardware and/or software components that perform the specified functions. For example, the described aspects can employ various integrated circuit components (e.g., memory elements, processing elements, logic elements, look-up tables, and the like), which can carry out a variety of functions under the control of one or more microprocessors or other control devices. Similarly, where the elements of the described aspects are implemented using software programming or software elements, the disclosure can be implemented with any programming or scripting languages, such as C, C++, Java, assembler, or the like, with the various algorithms being implemented with any combination of data structures, objects, processes, routines, or other programming elements. Functional aspects can be implemented in algorithms that execute on one or more processors. Furthermore, the aspects of the disclosure could employ any number of techniques for electronics configuration, signal processing and/or control, data processing, and the like. The words "mechanism" and "element" are used broadly and are not limited to mechanical or physical implementations or aspects, but can include software routines in conjunction with processors, etc.

Implementations or portions of implementations of the disclosure can take the form of a computer program product accessible from, for example, a computer-usable or computer-readable medium. A computer-usable or computer-readable medium can be any device that can, for example, tangibly contain, store, communicate, or transport a program or data structure for use by or in connection with any processor. The medium can be, for example, an electronic, magnetic, optical, electromagnetic, or semiconductor device, such as a hard disk drive, a memory device, a solid-state drive, a flash drive, or an optical drive. Other suitable mediums are also available. Such computer-usable or computer-readable media can be referred to as non-transitory memory or media. Unless otherwise specified, a memory of an apparatus described herein does not have to be physically contained in the apparatus, but can be a memory that can be accessed remotely by the apparatus, and does not have to be contiguous with other memory that might be physically contained in the apparatus.

Any of the individual or combined functions described herein as being performed as examples of the disclosure can be implemented using machine-readable instructions in the form of code for the operation of any or any combination of the aforementioned computational hardware. The computational code can be implemented in the form of one or more modules by which individual or combined functions can be performed as a computational tool, the input and output data of each module being passed to/from one or more further modules during operation of the methods, apparatuses, and systems described herein.

Information, data, and signals can be represented using a variety of different technologies and techniques. For example, any data, instructions, commands, information, signals, bits, symbols, and chips referenced herein can be represented by voltages, currents, electromagnetic waves, magnetic fields or particles, optical fields or particles, other items, or a combination of the foregoing.

The particular aspects shown and described herein are illustrative examples of the disclosure and are not intended to otherwise limit the scope of the disclosure in any way. For the sake of brevity, electronics, control systems, software development, and other functional aspects of the systems (and components of the individual operating components of the systems) cannot be described in detail herein. Furthermore, the connecting lines or connectors shown in the various figures presented are intended to represent example functional relationships and/or physical or logical couplings between the various elements. Many alternative or additional functional relationships, physical connections, or logical connections can be present in a practical device.

The word "example" is used herein to mean serving as an example, instance, or illustration. Any aspect or design described herein as "example" is not necessarily to be construed as being preferred or advantageous over other aspects or designs. Rather, use of the word "example" is intended to present concepts in a concrete fashion. As used in this disclosure, the term "or" is intended to mean an inclusive "or" rather than an exclusive "or" for the two or more elements it conjoins. That is, unless specified otherwise or clearly indicated otherwise by the context, "X includes A or B" is intended to mean any of the natural inclusive permutations thereof. In other words, if X includes A; X includes B; or X includes both A and B, then "X includes A or B" is satisfied under any of the foregoing instances. The term "and/or" as used in this disclosure is intended to mean an "and" or an inclusive "or." That is, unless specified otherwise or clearly indicated otherwise by the context, "X includes A, B, and/or C" is intended to mean that X can include any combinations of A, B, and C. In other words, if X includes A; X includes B; X includes C; X includes both A and B; X includes both B and C; X includes both A and C; or X includes all of A, B, and C, then "X includes A, B, and/or C" is satisfied under any of the foregoing instances. Similarly, "X includes at least one of A, B, and C" is intended to be used as an equivalent of "X includes A, B, and/or C." In addition, the articles "a" and "an" as used in this application and the appended claims should generally be construed to mean "one or more" unless specified otherwise or clear from the context to be directed to a singular form. Moreover, use of the term "an aspect" or "one aspect" throughout this disclosure is not intended to mean the same aspect or implementation unless described as such.

The use of "including" or "having" and variations thereof herein is meant to encompass the items listed thereafter and equivalents thereof as well as additional items. Unless specified or limited otherwise, the terms "mounted," "connected," "supported," "coupled," and variations thereof are used broadly and encompass both direct and indirect mountings, connections, supports, and couplings. Further, "connected" and "coupled" are not restricted to physical or mechanical connections or couplings.

The use of the terms "a" and "an" and "the" and similar referents in the context of describing the disclosure (especially in the context of the following claims) should be construed to cover both the singular and the plural. Furthermore, the recitation of ranges of values herein is intended merely to serve as a shorthand method of referring individually to each separate value falling within the range, unless otherwise indicated herein, and each separate value is incorporated into the specification as if it were individually recited herein. Finally, the operations of all methods described herein are performable in any suitable order unless otherwise indicated herein or otherwise clearly contradicted by the context. The use of any and all examples, or language suggesting that an example is being described (e.g., "such as"), provided herein is intended merely to better illuminate the disclosure and does not pose a limitation on the scope of the disclosure unless otherwise claimed.

It should be understood that although this disclosure uses terms such as first, second, third, etc., the disclosure should not be limited by or to these terms. These terms are used only to distinguish similar types of information from each other. For example, without departing from the scope of this disclosure, a first information can also be referred to as a second information; and similarly, a second information can also be referred to as a first information. Depending on the context, the word "if" as used herein can be interpreted as "when," "while," or "in response to."

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation as is permitted under the law so as to encompass all such modifications and equivalent arrangements.

What is claimed is:

1. A method of extracting shapes from a pixelated SRAF bitmap image of pixels for mask making, the method comprising:
   receiving the pixelated SRAF bitmap image of pixels, each pixel having a respective brightness value;
   selecting a ridge point in the pixelated SRAF bitmap image, the ridge point being one of the pixels and selected based on the respective brightness value of the one of the pixels;
   for each pixel of at least some of the pixels, determining a respective arrival time at the pixel, the respective arrival time being based on a respective brightness value of the pixel and a Mask Rule Check (MRC) rule; and
   determining a mask shape using the arrival times of the at least some of the pixels.

2. The method of claim 1, wherein receiving the pixelated SRAF bitmap image of pixels comprises:
   receiving a mask image from a design pattern comprising design shapes;
   simulating the mask image to generate a bitmap image; and
   generating the pixelated SRAF bitmap image by removing the design shapes from the bitmap image.

3. The method of claim 1, wherein determining the mask shape using the arrival times of the at least some of the pixels comprises selecting first boundary pixels for a first mask shape, the first boundary pixels corresponding to pixels having arrival times that are less than a first target arrival time.

4. The method of claim 3, further comprising:
   selecting second boundary pixels for a second mask shape, the second boundary pixels corresponding to pixels having arrival times that are less than a second target arrival time; and
   selecting, as the mask shape, the one of the first mask shape or the second mask shape corresponding to a smaller Edge Placement Error (ERE).

5. The method of claim 1, further comprising modifying the mask shape to resolve MRC rules violations.

6. The method of claim 5, wherein modifying the mask shape to resolve MRC rules violations comprises modifying the mask shape based on an internal pixel query and the MRC rules.

7. The method of claim 5, wherein modifying the mask shape to resolve MRC rules violations comprises modifying the mask shape based on an external pixel query and the MRC rules.

8. An apparatus for determining sub-resolution assist features (SRAFs) for mask making, the apparatus comprising:
   a processor; and
   a memory storing instructions executable by the processor to at least:
      receive a pixelated SRAF bitmap image of pixels, each pixel having a respective brightness value;
      determine, using a fast marching method (FMM), arrival times for at least some of the pixels, the FMM using a speed function that is based on a Mask Rule Check (MRC); and
      determine a SRAF shape using the arrival times of the at least some of the pixels.

9. The apparatus of claim 8, wherein the instructions to cause the processor to receive the pixelated SRAF bitmap image comprises instructions to cause the processor to:

generate a mask image from a design pattern comprising design shapes;
simulate the mask image to generate a bitmap image; and
generate the pixelated SRAF bitmap image by removing the design shapes from the bitmap image.

10. The apparatus of claim 8, wherein the instructions to cause the processor to determine the SRAF shape using the arrival times of the at least some of the pixels comprises instructions to cause the processor to select first boundary pixels for a first SRAF shape, the first boundary pixels corresponding to pixels having arrival times that are less than a first target arrival time.

11. The apparatus of claim 10, wherein the instructions further comprise instructions to cause the processor to:
select second boundary pixels for a second SRAF shape, the second boundary pixels corresponding to pixels having arrival times that are less than a second target arrival time; and
select, as the SRAF shape, the one of the first SRAF shape and the second SRAF shape corresponding to a smaller Edge Placement Error (EPE).

12. The apparatus of claim 8, wherein the instructions further comprise instructions to cause the processor to modify the SRAF shape to resolve MRC rules violations.

13. The apparatus of claim 12, wherein the instructions to cause the processor to modify the SRAF shape to resolve MRC rules violations comprises instructions to cause the processor to modify the SRAF shape based on an internal pixel query and the MRC rules.

14. The apparatus of claim 12, wherein the instructions to cause the processor to modify the SRAF shape to resolve MRC rules violations comprises instructions to cause the processor modify the SRAF shape based on an external pixel query and the MRC rules.

15. A method for extracting shapes from a pixelated SRAF bitmap image of pixels for mask making, the method comprising:
receiving the pixelated SRAF bitmap image of pixels, each pixel having a respective brightness value;
calculating a speed image, for use with a fast marching method, with mask-manufacturing (MRC) rules, the speed image being based on pixel brightness values;
generating an arrival time map using the fast marching method;
determining a binary SRAF image using the arrival time map; and
resolving MRC rule violations in the binary SRAF image.

16. The method of claim 15, wherein resolving MRC rule violations in the binary SR AF image comprises:
resolving the MRC rule violations using an internal pixel query; and
resolving the MRC rule violations using an external pixel query.

17. The method of claim 15, wherein determining a binary SRAF image using the arrival time map comprises:
generating a first binary SRAF image based on a first arrival time;
generating a second binary SRAF image based on a second arrival time; and
selecting, as the binary SRAF image, the first binary SRAF image or the second binary SRAF image resulting in a smaller Edge Placement Error (EPE).

18. The method of claim 15, wherein the binary SRAF image comprises a first shape and a second shape, and wherein resolving MRC rule violations in the binary SRAF image comprises modifying the first shape and the second shape to resolve a MRC rule violation.

19. The method of claim 15, wherein the binary SRAF image comprises a shape, and wherein resolving MRC rule violations in the binary SRAF image comprises removing the shape to resolve a MRC rule violation.

20. The method of claim 15, wherein the MRC rules comprise a maximum shape edge size, and wherein generating the arrival time map using the fast marching method comprises:
calculating a distance from a pixel that is a ridge point to another pixel; and
setting the arrival time of the other pixel to a large value based on a comparison of the distance to the maximum shape size.

* * * * *